(12) United States Patent
Schmit (10) Patent No.: US 9,307,680 B2
(45) Date of Patent: Apr. 5, 2016

(54) COOLED ELECTRONIC PART ENCLOSURE

(71) Applicant: Deere & Company, Moline, IL (US)

(72) Inventor: Christopher J. Schmit, Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 338 days.

(21) Appl. No.: 13/916,382

(22) Filed: Jun. 12, 2013

(65) Prior Publication Data

US 2014/0368099 A1    Dec. 18, 2014

(51) Int. Cl.
*H05K 5/02* (2006.01)
*H05K 7/20* (2006.01)

(52) U.S. Cl.
CPC ........ *H05K 7/20872* (2013.01); *H05K 7/20927* (2013.01); *H05K 7/20936* (2013.01)

(58) Field of Classification Search
CPC .......... H05K 7/20218; H05K 7/20272; H05K 9/0033; H05K 9/0037
USPC .............. 361/679.49, 679.53, 688, 690, 698, 361/699; 165/80.4, 80.5, 168; 174/522, 547
See application file for complete search history.

(56) References Cited

U.S. PATENT DOCUMENTS

| | | | |
|---|---|---|---|
| 5,901,037 A | 5/1999 | Hamilton et al. | |
| 6,105,662 A | 8/2000 | Suzuki | |
| 6,757,168 B2 * | 6/2004 | Yatougo et al. | 361/690 |
| 6,816,381 B2 | 11/2004 | Takeuchi | |
| 7,334,630 B2 | 2/2008 | Goodson et al. | |
| 8,243,451 B2 * | 8/2012 | Dede et al. | 361/702 |

* cited by examiner

Primary Examiner — Tuan T Dinh
Assistant Examiner — Mukund G Patel (57) ABSTRACT

A case assembly encloses heat generating electronic components. The case includes first and second housing parts which can be cast from the same mold. Covers are mounted to the housings to form coolant passages. The housing parts include built-in the connecting parts which are coupled together to form additional coolant passages. One of the connecting parts has a lip which sealingly receives an end of another connecting part. The lip is received by a slot adjacent to the other connecting part. The slot communicates with an exterior of the housing.

21 Claims, 11 Drawing Sheets

COOLED ELECTRONIC PART ENCLOSURE

FIELD

The present disclosure relates to a cooled enclosure for electronic components.

BACKGROUND

Power inverters and converters have enclosures with cooling channels that cool the high power electronic parts inside the enclosure. Often the cooling structure is constructed so a liquid fluid can be pumped through the structure to cool the electronics. With higher power demands, the cooling structures are growing in complexity, such as double sided cooling structures and also cooling plates surrounding the electronics inside. With the growing complexity there has not been a double sided cooling structure which can be assembled without adding additional parts or compromising the environmental integrity of the unit.

SUMMARY

According to an aspect of the present disclosure, a case assembly encloses heat generating electronic components. The case includes first and second housing parts which can be cast from the same mold. Covers are mounted to the housings to form coolant passages. The housing parts include built-in the connecting parts which are coupled together to form additional coolant passages. One of the connecting parts has a lip which sealingly receives an end of another connecting part. The lip is received by a slot adjacent to the other connecting part. The slot communicates with an exterior of the housing so that if a breach in the connecting parts should happen to leak coolant, the leak will vent coolant to the exterior of the housing, and not to the electronic components inside. After the housings parts are molded, other features and differences can be created by secondary machining operations. The portions of the housings which include the connection parts are complete mirror images of each other.

Thus, a cooling enclosure is provided which does not require additional separate connecting part to be added to the assembly. The similar housing parts can be made by die-casting methods and with the integral connecting parts on the exterior of the housings and with their own fluid seal. The result is a rugged assembly with a main environmental seal which is not compromised if a seal between the connecting parts should fail.

DETAILED DESCRIPTION OF THE DRAWINGS

Figure 1:
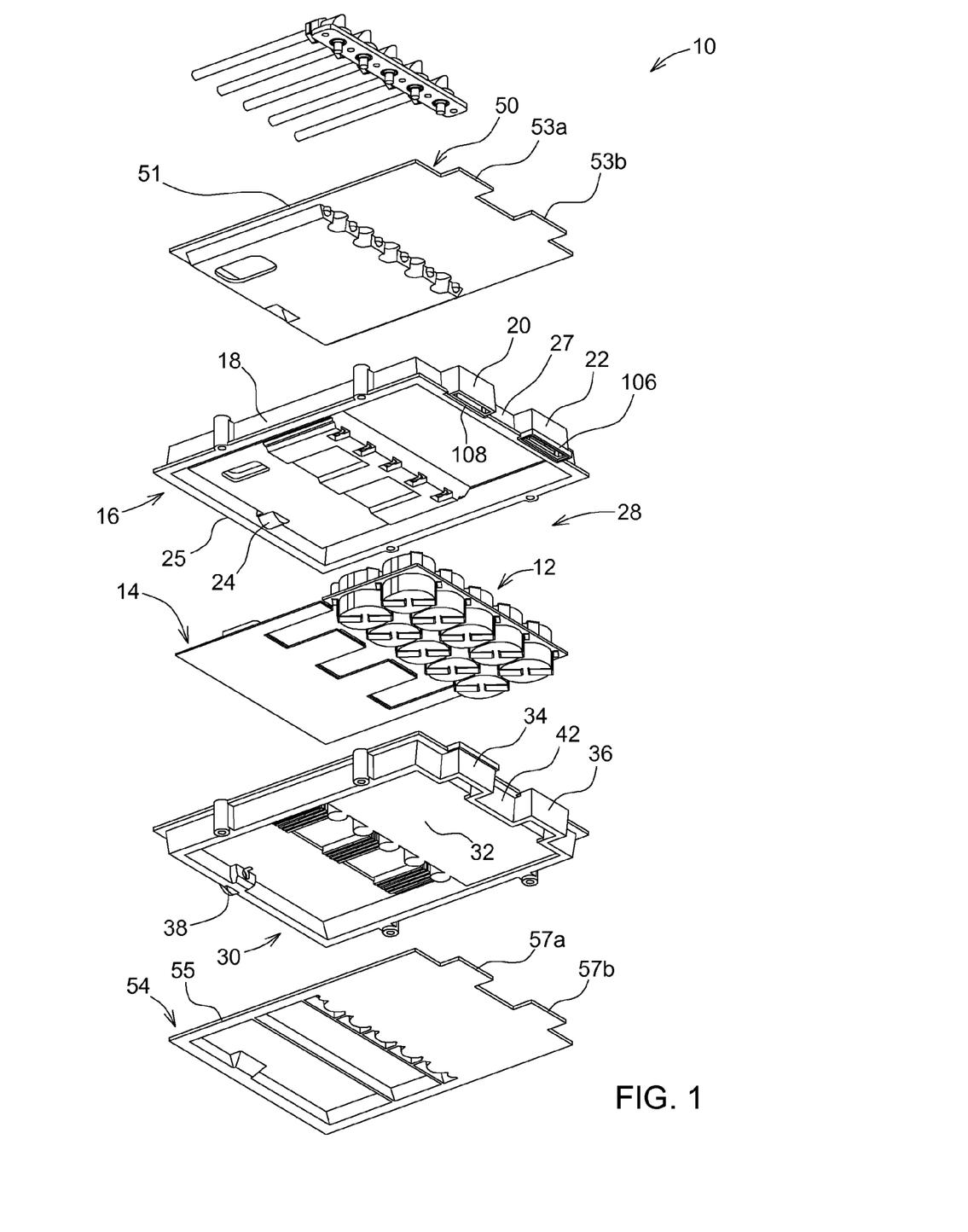
FIG. 1 is a perspective exploded assembly view of a case assembly embodying the invention.

Referring to FIG. 1, a case assembly 10 contains heat generating electronic components 12 mounted on a conventional circuit board or PCB board 14. The case assembly 10 includes a first housing 16 which has a first main body 18 and hollow first connecting parts or tabs 20 and 22 which are joined to the first main body 18. The first housing 16 has a coolant inlet 24 formed in the first main body 18 at a location spaced apart from the first connecting parts, and preferably at an end 25 of the main body 18 which is opposite to the end 27 to which the connecting parts 20 and 22 are joined.

The case assembly 10 also includes a second housing 30 which is attached to the first housing 16 so that the first and second housings form an inner enclosure 28 which surrounds the electronic components 12 and the circuit board 14. The second housing 30 includes a second main body 32 and hollow second connecting parts or tabs 34 and 36 which are joined to the second main body 32. The second housing 30 has a coolant outlet 38 formed in the second main body 32 at a location spaced apart from the second connecting parts, and preferably at an end 40 of the main body 32 which is opposite to the end 42 to which the connecting parts 34 and 36 are joined. The connecting 20, 22, 34 and 36 are integral to their respective housings 16 and 30.

Figure 11:
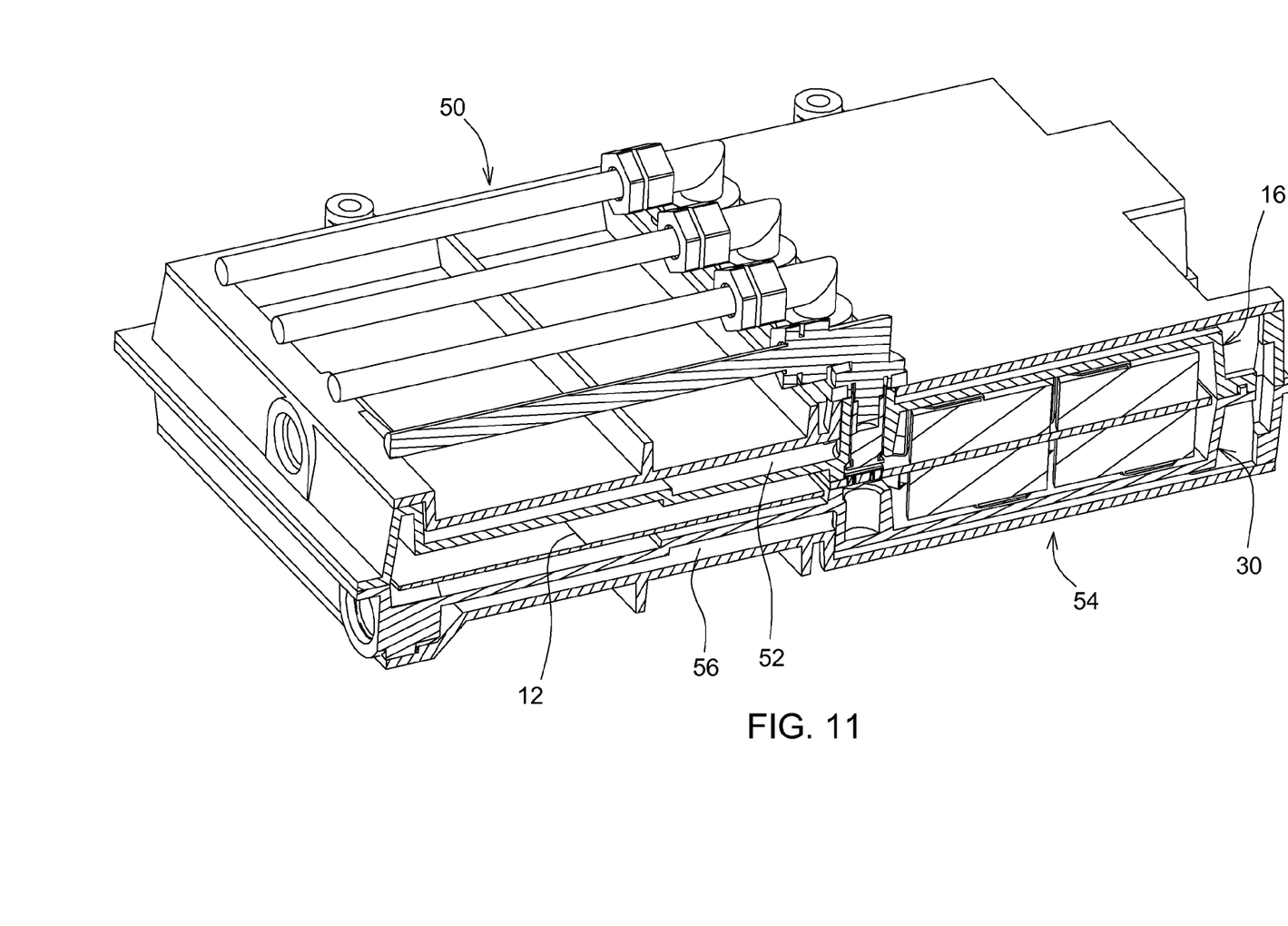
FIG. 11 is a perspective assembly view of the case assembly of FIG. 1.

The assembly 10 also includes a first cover 50 which is mounted over the first housing 16. A first coolant passage 52 (FIG. 11) is formed between the first housing 16 and the first cover 50. The assembly 10 also includes a second cover 54 which is mounted to the second housing 30. A second coolant passage 56 (FIG. 11) is formed between the second housing 30 and the second cover 54. The first cover 50 includes a main body 51 and a pair of tabs 53a and 53b which project outwardly from the body 51. The tabs 53a and 53b sealingly engage the upper ends of respective connecting parts 20 and 22. Similarly, the second cover 54 includes a main body 55 and a pair of tabs 57a and 57b which project outwardly from the body 55. The tabs 57a and 57b sealingly engage the lower ends of respective connecting parts 34 and 36.

The first connecting part 20 is coupled to second connecting part 34 to form a third coolant passage 60 which communicates the first coolant passage 52 with the second coolant passage 56. Similarly, the first connecting part 22 is coupled to second connecting part 36 to form another coolant passage 62 which communicates the first coolant passage 52 with the second coolant passage 56. Thus, the first coolant passage 52 communicates the inlet 24 the passages formed by connecting parts 20, 22, 36 and 36, and the second coolant passage 56 communicates the passages formed by connecting parts 20, 22, 36 and 36 with the outlet 38. As a result, coolant flows from inlet 24 to outlet 38 via first passage 52, connecting parts 20, 22, 36 and 36, and second passage 56.

Figure 2:
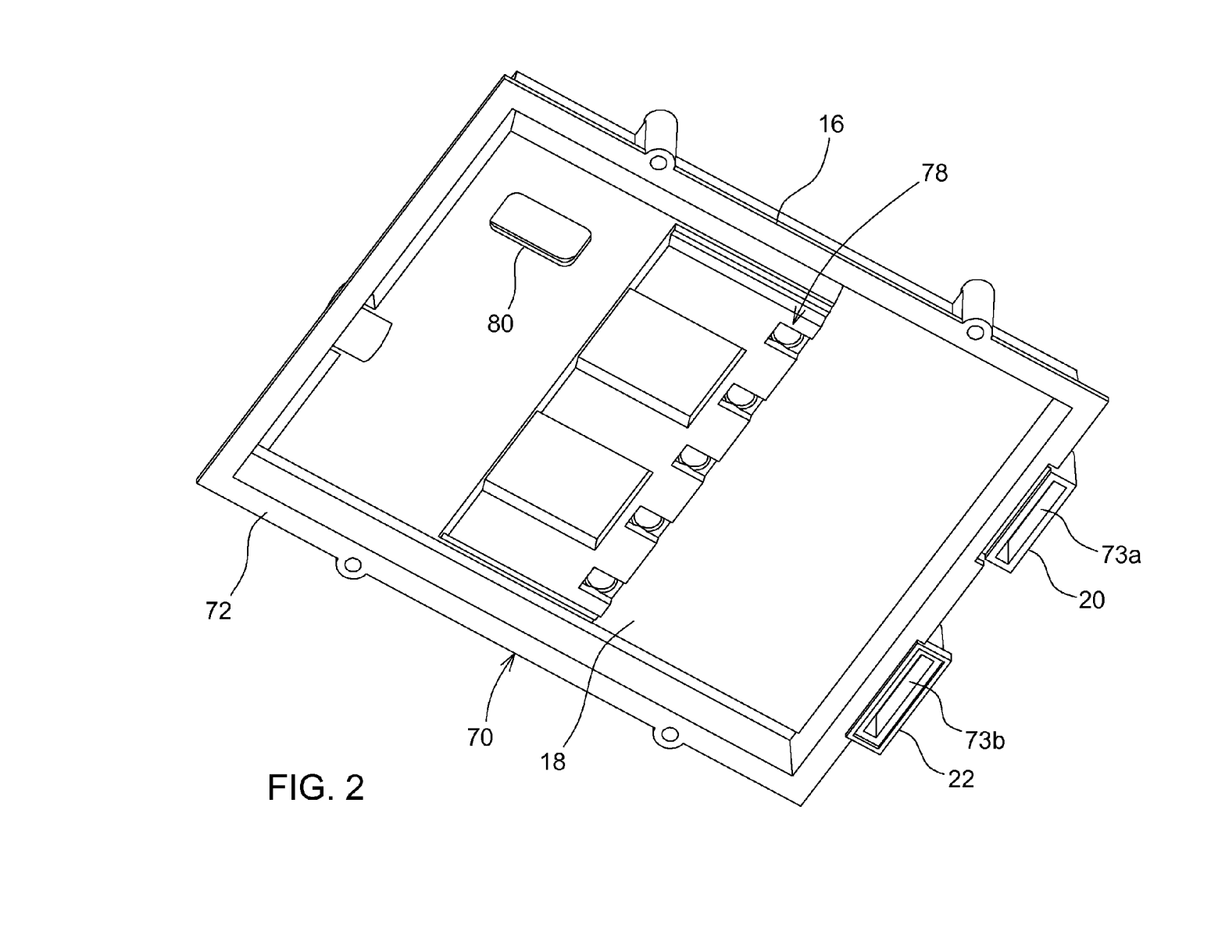
FIG. 2 is a bottom perspective view of the first housing of FIG. 1.
Figure 3:
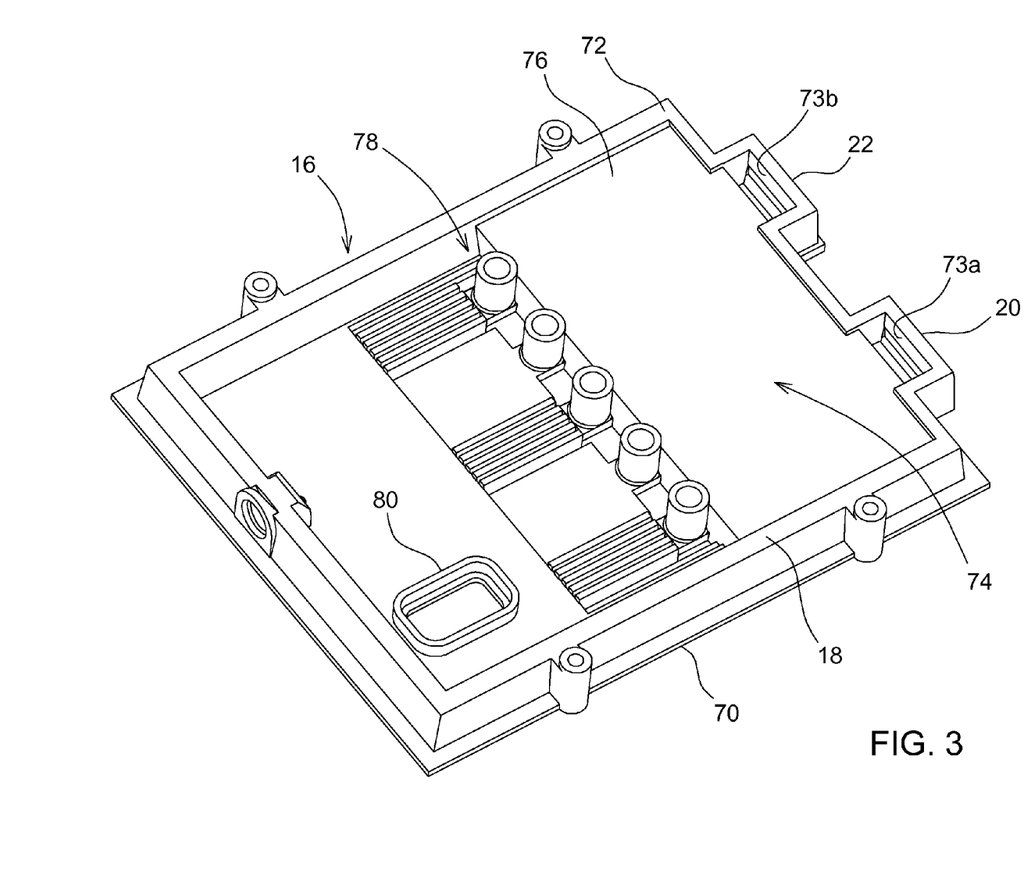
FIG. 3 is a top perspective view of the first housing of FIG. 1.

Referring now to FIGS. 2 and 3, the first housing 16 has an outer lip 70 which surrounds a lower end the main body 18, and a sealing surface 72 which forms an upper surface of the first housing 16. The main body 18 includes a plate 74. The connecting parts 20 and 22 form openings 73a and 73b adjacent to an outer end of the plate 74. Adjacent to the connecting parts 20 and 22, the top surface 76 of the plate 74 is spaced apart or recessed below the sealing surface 72. Thus, when the first cover 50 is sealingly attached to the sealing surface 72, there will be a gap between the plate 74 and the first cover 50. This gap forms part of the first coolant passage 52 and communicates with the openings 73a and 73b. The first housing also includes a set of electrical cable ports 78 and a cable opening 80.

Figure 4:
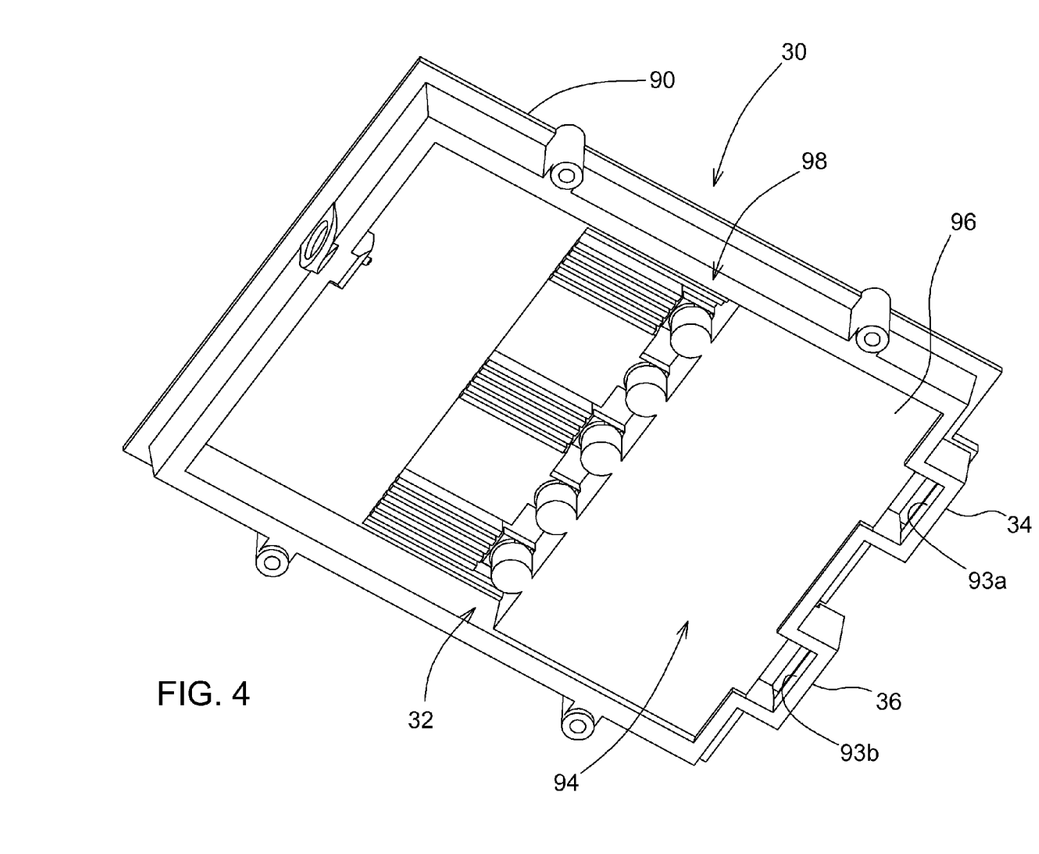
FIG. 4 is a bottom perspective view of the second housing of FIG. 1.
Figure 5:
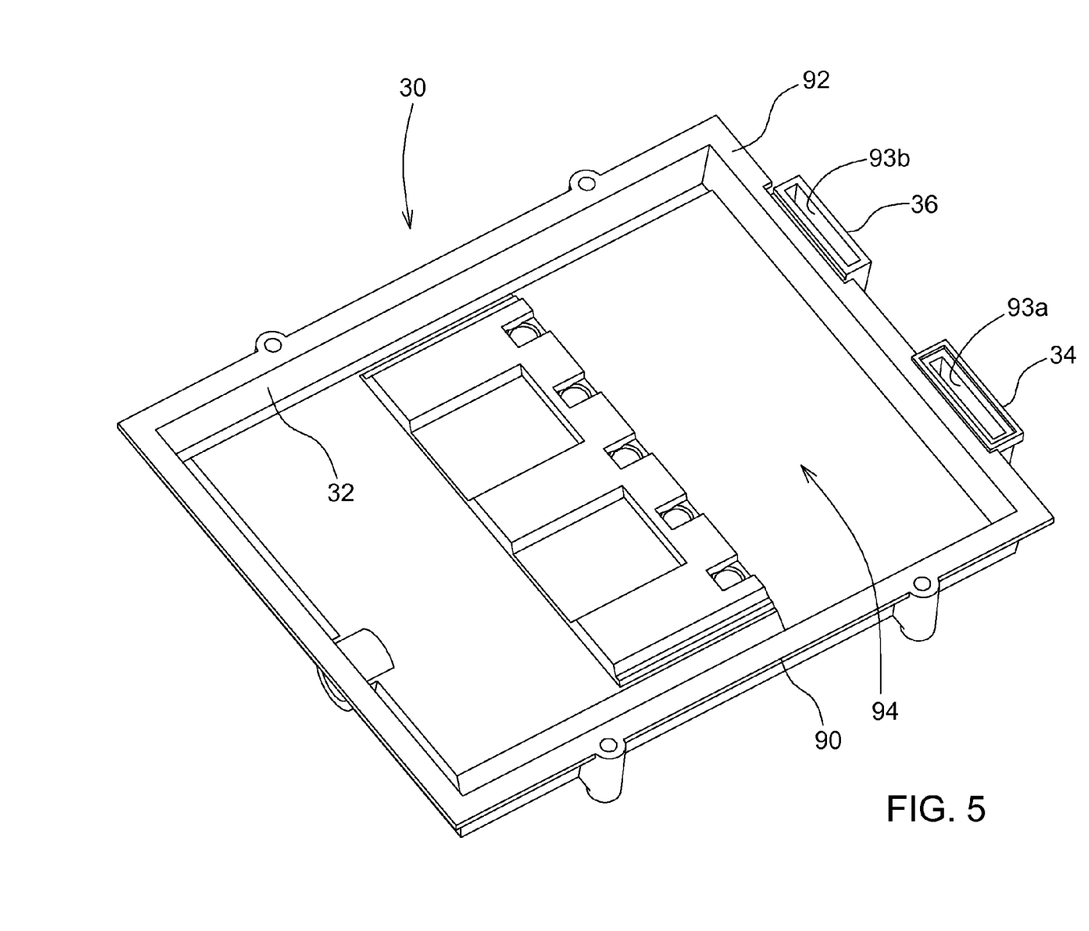
FIG. 5 is a top perspective view of the second housing of FIG. 1.

Referring now to FIGS. 4 and 5, the second housing 30 has an outer lip 90 which surrounds an upper end the main body 32, and a sealing surface 92 which forms an upper surface of the second housing 30. The main body 32 includes a plate 94. The connecting parts 34 and 36 form openings 93a and 93b adjacent to an outer end of the plate 94. Adjacent to the connecting parts 34 and 36, the lower surface 96 of the plate 94 is spaced apart or recessed from the sealing surface 92. Thus, when the second cover 54 is sealingly attached to the second housing 30, there will be a gap between the plate 94 and the second cover 54. This gap forms part of the second coolant passage 56 and communicates with the openings 93a and 93b. The first housing also includes a set of unused electrical cable ports 98 (which are filled or plugged) and may have no other cable opening. Thus, except for the cable ports 98 and the cable opening 100, the first housing 16 and the second housing 30 are identical to each other.

Figure 6:
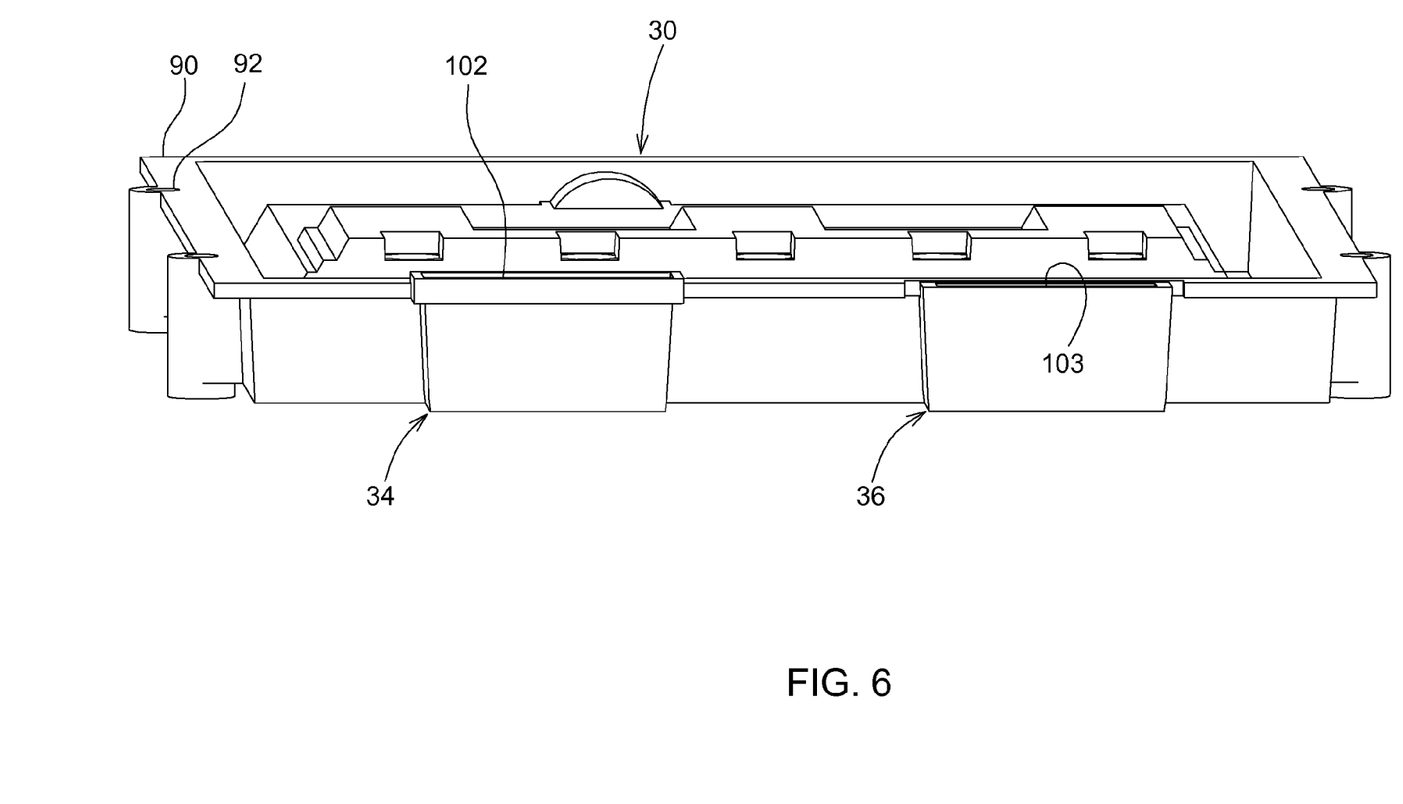
FIG. 6 is an end perspective view of the second housing of FIG. 1
Figure 7:
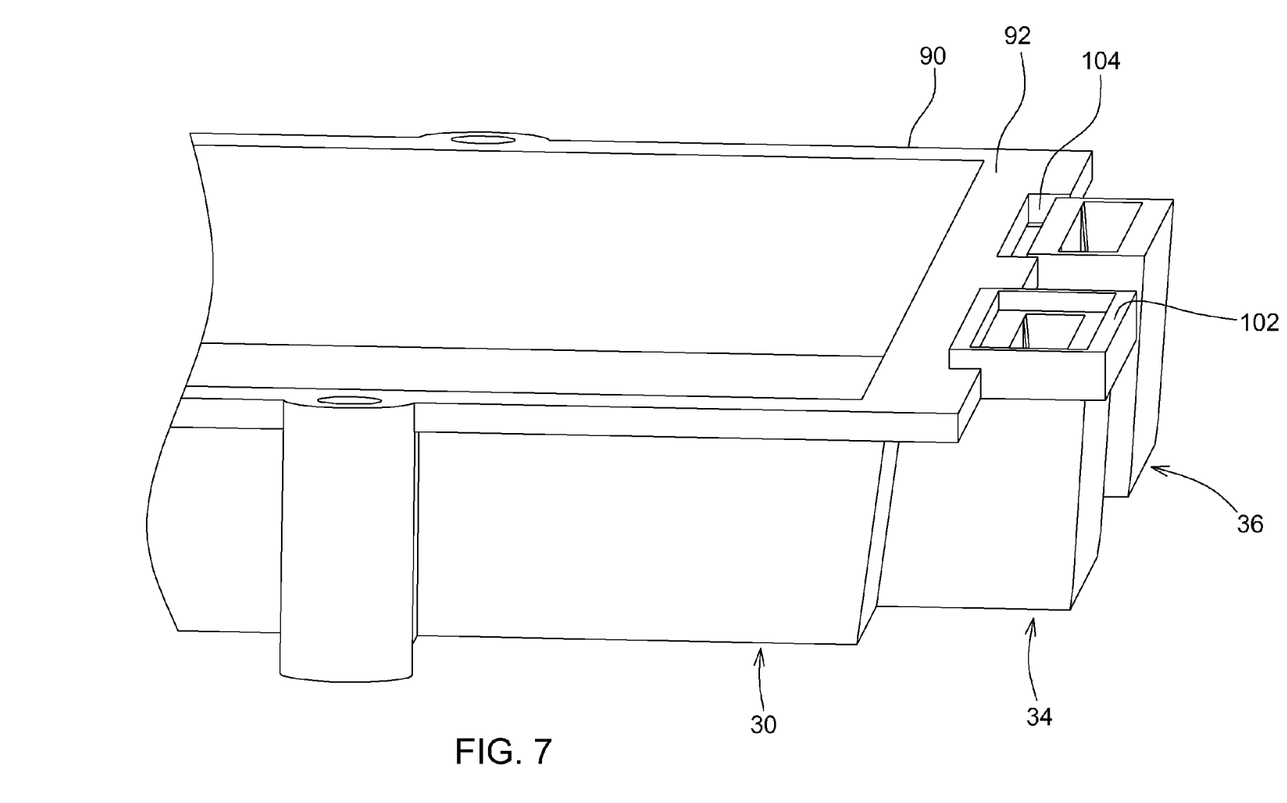
FIG. 7 is an enlarged side perspective view of a portion of the second housing of FIG. 1.
Figure 8:
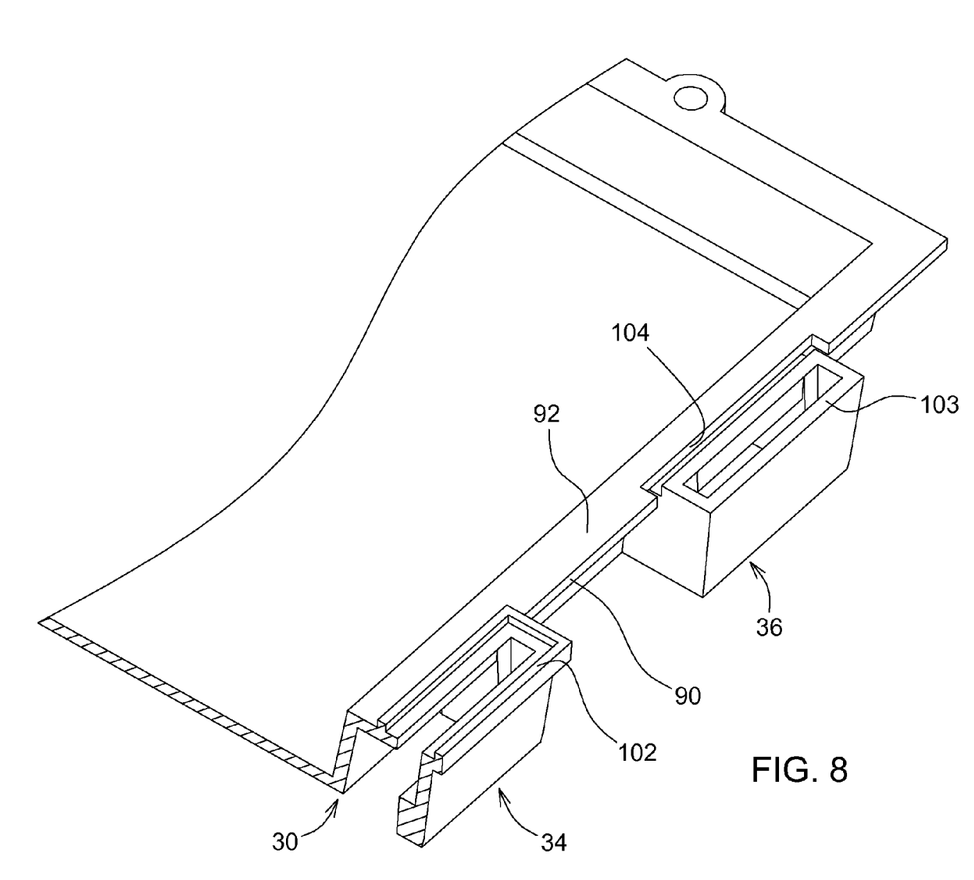
FIG. 8 is an enlarged corner perspective view of a portion of the second housing of FIG. 1.

As seen in FIG. 1, both housings 16 and 30 have a plurality (preferably two) connecting tabs. Since these parts of the housings 16 and 30 are identical, the following description will focus on housing 30 as seen in FIGS. 6-8. Connecting tabs 34 and 36 are hollow and spaced laterally apart from each other. Both Connecting tabs 34 and 36 are tapered from wider upper ends to narrower lower ends. The upper end of tab 34 is surrounded by a lip 102.

Figure 9:
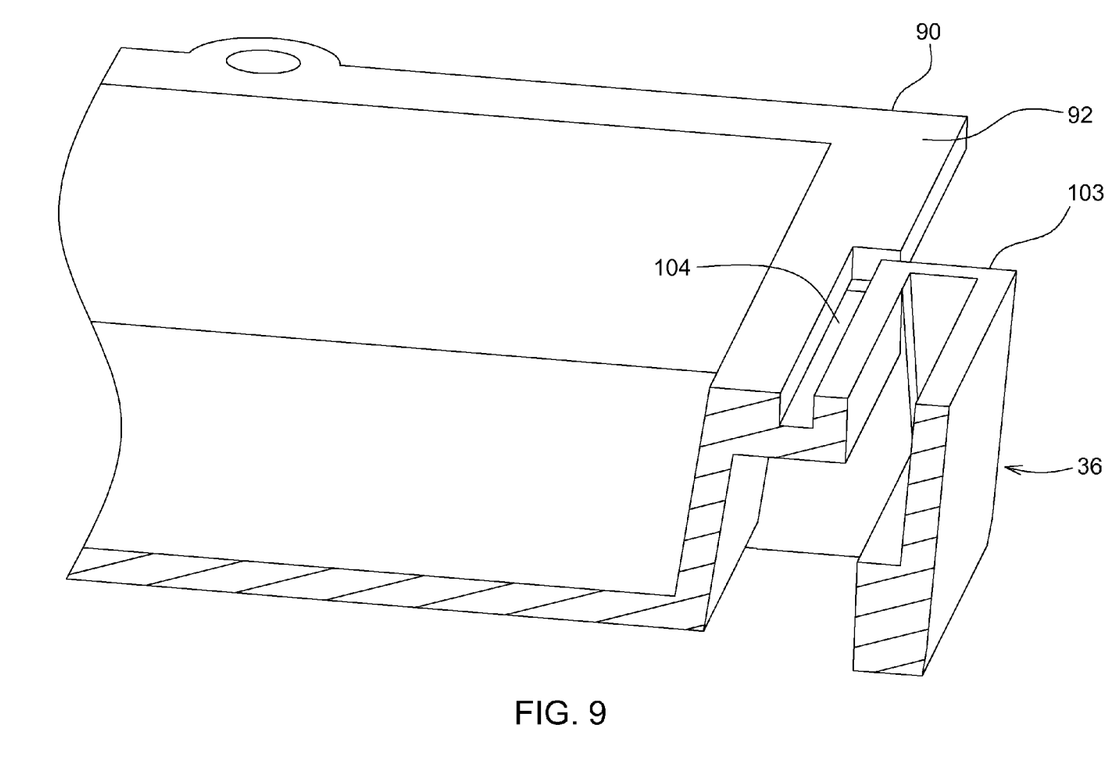
FIG. 9 is an enlarged perspective view of a portion of FIG. 8.
Figure 10:
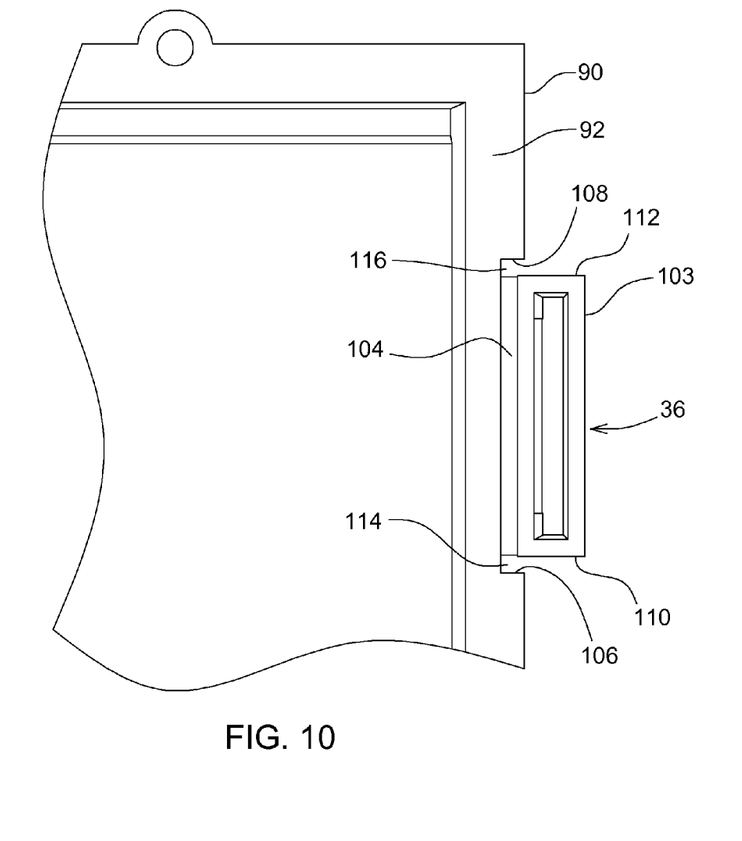
FIG. 10 is an enlarged top view of a portion of FIG. 8.

As best seen in FIGS. 8-10, the lip 90 is recessed to form a slot 104 adjacent to the inner side of the upper end 103 of tab 36. The lip 90 also forms a pair of shoulders 106 and 108 which are spaced apart from the sides 110 and 112 of the tab 36. Thus, spaces 114 and 116 are formed at opposite ends of the slot 104. The slot 104 and the spaces 114 and 116 communicate with the bottom exterior of the housing 30. The slot 104 and the spaces 114 and 116 thereby provide a leakage path so that coolant which escapes from the interior of the connecting tabs can exit from the enclosure 28 enclosed by housings 16 and 30 and not come in contact with the electrical components 12.

As a result, when the housings 16 and 30 are joined together, the bottom end of tab 20 will be received by the lip 102 of tab 34, and the upper end 103 of tab 36 will be received by an identical lip (106 in FIG. 1) of tab 22. In addition, lip 102 of tab 34 will be received by an identical slot (108 in FIG. 1) of tab 20. A sealant, such as RTV, is used to create a sealed connection between sealing surfaces 72 and 92 and between the connecting parts of housings 16 and 30. The connecting parts 20, 22, 34 and 36 have inter-engaging sealing parts which are separate from the main sealing surfaces 72 and 92.

The housings 16 and 30 may be cast from the same die-cast mold. The holes in one of the covers and the differences of the PCB board supports (PCB board supports not modeled) may be created by a later secondary machining process. The ends of the housings with the connection tabs are complete mirror images of each other, and the connection tabs form part of the passage through which coolant is circulated around the housings 16 and 30. The result is a new cooled electronic part enclosure which does not require additional connecting parts. It provides a low cost assembly which includes built-in connecting coolant passages in an assembly with parts which are similar or mirrored images of each other.

While the disclosure has been illustrated and described in detail in the drawings and foregoing description, such illustration and description is to be considered as exemplary and not restrictive in character, it being understood that illustrative embodiments have been shown and described and that all changes and modifications that come within the spirit of the disclosure are desired to be protected. It will be noted that alternative embodiments of the present disclosure may not include all of the features described yet still benefit from at least some of the advantages of such features. Those of ordinary skill in the art may readily devise their own implementations that incorporate one or more of the features of the present disclosure and fall within the spirit and scope of the present invention as defined by the appended claims.

I claim:

1. A case assembly for containing a heat generating electronic component, said case assembly comprising:
   a first housing, the first housing comprising a first main body and a hollow first connecting part which is joined to the first main body;
   a second housing for attaching to the first housing so that the first and second housings form an inner enclosure which surrounds the heat generating electronic component, the second housing comprising a second main body and a hollow second connecting part which is joined to the second main body;
   a first cover mounted to the first housing; and
   a second cover mounted to the second housing;
   a first liquid coolant passage formed between the first housing and the first cover; and
   a second liquid coolant passage formed between the second housing and the second cover, the first and second connecting parts being coupled together in sealed engagement to form a third coolant passage for a liquid coolant where the third coolant passage communicates the first coolant passage with the second coolant passage.

2. The case assembly of claim 1, wherein:
   each connecting part is exterior to the corresponding main body.

3. The case assembly of claim 1, wherein:
   the first housing has a portion which is identical to a portion of the second housing.

4. The case assembly of claim 1, wherein:
   the first housing has a coolant inlet formed in the first main body at a location spaced apart from the first connecting part; and
   the second housing has a coolant outlet formed in the second main body at a location spaced apart from the second connecting part.

5. The case assembly of claim 1, wherein:
   the first housing has an electrical cable connection port; and
   except for the electrical cable connection port, the first housing is identical to the second housing.

6. The case assembly of claim 1, wherein:
   the second connecting part has a lip which sealingly receives an end of the first connecting part.

7. The case assembly of claim 6, wherein:
   the first housing has a slot which receives the lip of the second connecting part.

8. The case assembly of claim 7, wherein:
   the slot communicates the inner enclosure to an exterior of the first housing.

9. The case assembly of claim 1, wherein:
   the first housing has a first sealing lip which sealingly engages a second sealing lip of the second housing;

a slot is formed by a recess in the second sealing lip, the slot being adjacent to a side of the second connecting part, the slot being communicated to an exterior of the second housing.

10. A case assembly for containing a heat generating electronic component, said case assembly comprising:
a first housing, the first housing comprising a first main body and hollow first and second connecting parts which are joined to the first main body;
a second housing for attaching to the first housing so that the first and second housings form an inner enclosure which surrounds the heat generating electronic component, the second housing comprising a second main body and hollow third and fourth connecting part which are joined to the second main body;
a first cover mounted to the first housing; and
a second cover mounted to the second housing;
a first liquid coolant passage formed between the first housing and the first cover; and
a second liquid coolant passage formed between the second housing and the second cover, the first and third connecting parts being coupled together in sealed engagement to form a third coolant passage for a liquid coolant which communicates the first coolant passage with the second coolant passage, and the second and fourth connecting parts being coupled together in sealed engagement to form a fourth coolant passage for a liquid coolant, which communicates the first coolant passage with the second coolant passage.

11. The case assembly of claim 10, wherein:
each connecting part is exterior to the corresponding main body.

12. The case assembly of claim 10, wherein:
the first housing has a portion which is identical to a portion of the second housing.

13. The case assembly of claim 10, wherein:
the first housing has a coolant inlet formed in the first main body at a location spaced apart from the first and second connecting parts; and
the second housing has a coolant outlet formed in the second main body at a location spaced apart from the third and fourth connecting parts.

14. The case assembly of claim 10, wherein:
the first housing has an electrical cable connection port; and
except for the electrical cable connection port, the first housing is identical to the second housing.

15. The case assembly of claim 10, wherein:
the first and fourth connecting parts are identical to each other, and
the second and third connecting parts are identical to each other.

16. The case assembly of claim 10, wherein:
the first connecting part is sealingly received by the third connecting part, and
the fourth connecting part is sealingly received by the second connecting part.

17. The case assembly of claim 10, wherein:
the second connecting part has a lip which sealingly receives an end of the fourth connecting part; and
the third connecting part has a lip which sealingly receives an end of the first connecting part.

18. The case assembly of claim 17, wherein:
the first housing has a slot which receives the lip of the third connecting part; and
the second housing has a slot which receives the lip of the second connecting part.

19. The case assembly of claim 18, wherein:
each slot communicates the inner enclosure to an exterior of the corresponding housing.

20. The case assembly of claim 10, wherein:
the first housing has a first sealing lip which sealingly engages a second sealing lip of the second housing;
a first slot is formed by a recess in the first sealing lip, the first slot being adjacent to a side of the first connecting part, the slot being communicated to an exterior of the first housing; and
a second slot is formed by a recess in the second sealing lip, the second slot being adjacent to a side of the fourth connecting part, the second slot being communicated to an exterior of the second housing.

21. A case assembly for containing a heat generating electronic component, said case assembly comprising:
a first housing, the first housing comprising a first main body defining a first liquid coolant passage, an integral hollow first connecting part which is connected to the first liquid coolant passage of the first main body, and a first main sealing surface; and
a second housing for attaching to the first housing so that the first and second
housings form an inner enclosure which surrounds the electronic component, the second housing comprising a second main body defining a second coolant passage, an integral hollow second connecting part which is connected to the second liquid coolant passage of the second main body, and a second main sealing surface which sealingly engages the first main sealing surface, the first and second connecting parts being coupled together to form a portion of a third coolant passage for a liquid coolant, first and second connecting parts having inter-engaging sealing parts that are separate from the main sealing surfaces.

* * * * *